United States Patent
Doglio et al.

(10) Patent No.: US 12,453,045 B2
(45) Date of Patent: Oct. 21, 2025

(54) LIQUID LINE ROUTING APPARATUS FOR INFORMATION TECHNOLOGY EQUIPMENT

(71) Applicant: Dell Products, L.P., Round Rock, TX (US)

(72) Inventors: Jean Marie Doglio, Round Rock, TX (US); Daniel Alvarado, Pflugerville, TX (US)

(73) Assignee: Dell Products, L.P., Round Rock, TX (US)

( * ) Notice: Subject to any disclaimer, the term of this patent is extended or adjusted under 35 U.S.C. 154(b) by 176 days.

(21) Appl. No.: 17/813,615

(22) Filed: Jul. 20, 2022

(65) Prior Publication Data

US 2024/0032240 A1 Jan. 25, 2024

(51) Int. Cl.
*H05K 7/20* (2006.01)

(52) U.S. Cl.
CPC ..... *H05K 7/20272* (2013.01); *H05K 7/20254* (2013.01); *H05K 7/20772* (2013.01)

(58) Field of Classification Search
CPC ........... H05K 7/20218; H05K 7/20272; H05K 7/20254; H05K 7/20327; H05K 7/20336; H05K 7/2039; H05K 7/20772; H05K 7/20781; H05K 7/20763; H05K 7/20281; H05K 7/20509; H05K 7/20627; H05K 7/20872; H05K 7/2029; H05K 7/20981; H05K 7/20936; H05K 7/208; H05K 7/2089; H05K 7/20263; H05K 5/0217; H05K 2201/064; G06F 2200/201; G06F 1/20; G06F 1/203
See application file for complete search history.

(56) References Cited

U.S. PATENT DOCUMENTS

| | | | | |
|---|---|---|---|---|
| 6,301,105 B2* | 10/2001 | Glorioso | ................ | G11B 33/08 361/801 |
| 7,333,334 B2* | 2/2008 | Yamatani | .................. | G06F 1/20 174/15.1 |
| 8,456,833 B2* | 6/2013 | Eagle | ................. | H05K 7/20781 361/699 |
| 9,504,184 B2* | 11/2016 | Krug, Jr. | ............ | H05K 7/20218 |
| 10,477,725 B2* | 11/2019 | Chen | .................. | H05K 7/20272 |
| 10,609,839 B1* | 3/2020 | Archer | .................. | F28D 1/0206 |
| 11,096,313 B2* | 8/2021 | Amos | ................... | H01L 23/473 |
| 11,246,242 B2* | 2/2022 | Ochiai | ...................... | G06F 1/20 |

(Continued)

*Primary Examiner* — Allen L Parker
*Assistant Examiner* — Gage Crum
(74) *Attorney, Agent, or Firm* — Fogarty LLP

(57) ABSTRACT

An information technology equipment enclosure comprises a plurality of IT components with cold plates coupled to the IT components. A cooling fluid manifold is disposed within the IT equipment enclosure, wherein each of the cold plates are coupled to the cooling fluid manifold via an input coolant line and an output coolant line. A liquid line routing assembly is disposed within the enclosure. The liquid line routing assembly comprises at least one sidewall and one or more openings in the at least one sidewall. The openings are configured to provide a path to route input coolant lines and output coolant lines to selected ones of the cold plates. The at least one sidewall includes a gate structure positioned over at least one of the openings. The gate structure is configured to pivot away from the at least one opening to provide access to the opening.

20 Claims, 8 Drawing Sheets

(56) References Cited

U.S. PATENT DOCUMENTS

| | | | | |
|---|---|---|---|---|
| 11,460,899 B2* | 10/2022 | Pennington, Jr. | .. | H05K 7/20263 |
| 2005/0141196 A1* | 6/2005 | Yamatani | ................ | G06F 1/20 |
| | | | | 361/689 |
| 2007/0125523 A1* | 6/2007 | Bhatti | ................ | H05K 7/20772 |
| | | | | 165/80.4 |
| 2011/0099775 A1* | 5/2011 | Chou | ................ | H02G 3/32 |
| | | | | 24/489 |
| 2011/0313576 A1* | 12/2011 | Nicewonger | ...... | H05K 7/20781 |
| | | | | 361/701 |
| 2014/0126140 A1* | 5/2014 | Wang | ................ | G06F 1/187 |
| | | | | 361/679.37 |
| 2014/0151999 A1* | 6/2014 | Imaki | ................ | G02B 6/3814 |
| | | | | 285/308 |
| 2015/0070844 A1* | 3/2015 | Chang | ................ | H05K 7/20636 |
| | | | | 165/104.34 |
| 2018/0279510 A1* | 9/2018 | Johnson | ................ | H05K 7/20772 |
| 2018/0324984 A1* | 11/2018 | Marroquin | ......... | H05K 7/20254 |
| 2019/0124797 A1* | 4/2019 | Norton | ................ | H05K 7/20172 |
| 2020/0093031 A1* | 3/2020 | Chopra | ................ | H05K 7/20218 |
| 2021/0385978 A1* | 12/2021 | Shao | ................ | H05K 7/1489 |
| 2022/0124942 A1* | 4/2022 | Tan | ................ | H05K 7/20272 |
| 2022/0248570 A1* | 8/2022 | Chen | ................ | H05K 7/20281 |
| 2022/0338384 A1* | 10/2022 | Hogan | ................ | H05K 7/20781 |
| 2022/0408608 A1* | 12/2022 | Isoya | ................ | H05K 7/20272 |
| 2023/0018736 A1* | 1/2023 | Tsai | ................ | H05K 7/20272 |
| 2023/0082042 A1* | 3/2023 | Li | ................ | G11B 33/128 |
| | | | | 361/679.02 |
| 2023/0085165 A1* | 3/2023 | Gao | ................ | H05K 7/1489 |
| | | | | 361/699 |

* cited by examiner

LIQUID LINE ROUTING APPARATUS FOR INFORMATION TECHNOLOGY EQUIPMENT

FIELD

The present disclosure generally relates to Information Handling Systems and, more particularly, to a device for managing liquid cooling lines in an information technology enclosure.

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

As IHS components such as processors, graphics cards, random access memory (RAM), etc. have increased in clock speed and power consumption, the amount of heat produced by such components during normal operation has also increased. Often, the temperatures of these components need to be kept within a selected range to prevent overheating, instability, malfunction, and damage that would lead to a shortened component lifespan and lowered datacenter reliability. Accordingly, cooling systems often been used in IHSs to cool certain components. To control the temperature of components of an IHS, an approach may include using a "passive" cooling system that serves to reject heat of a component to air driven by one or more system-level air movers (e.g., fans, blowers, etc.). A different approach may include using an "active" cooling system in which a heat-exchanging cold plate is thermally coupled to the IHS component, and a chilled fluid is passed through conduits internal to the cold plate to remove heat from that component. Using liquid cooling systems can present difficulties in routing the liquid lines in tight spaces within an information technology enclosure.

SUMMARY

In an example embodiment, an information technology equipment enclosure comprises a plurality of IT components with cold plates coupled to the IT components. A cooling fluid manifold is disposed within the IT equipment enclosure, wherein each of the cold plates are coupled to the cooling fluid manifold via an input coolant line and an output coolant line. A liquid line routing assembly is disposed within the enclosure. The liquid line routing assembly comprises at least one sidewall and one or more openings in the at least one sidewall. The openings are configured to provide a path to route input coolant lines and output coolant lines to selected ones of the cold plates. The at least one sidewall includes at least one gate structure positioned over at least one of the openings. The gate structures are configured to pivot away from the at least one opening to provide access to the opening. The gate structure may also be configured as removeable from the at least one opening to provide access to the opening.

The liquid line routing assembly comprises two interior sidewalls and one or more openings in each of the interior sidewalls. The openings are configured to provide a path to route input coolant lines and output coolant lines to selected ones of the cold plates.

The cooling fluid manifold has a plurality of input connectors coupled to input coolant lines and a plurality of output connectors coupled to output coolant lines. The liquid line routing assembly may comprise a sidewall having a plurality of openings. The openings being configured to allow the input connectors and the output connectors to extend therethrough. The liquid line routing assembly may also include a flange configured to extend over the cooling fluid manifold.

The liquid line routing assembly may comprise at least one structure attached to a top edge of the sidewall. The structure configured for alignment or attachment of IT components mounted above the liquid line routing assembly. The at least one structure may be attached to a top edge of the sidewall comprises one or more of a pin, post, slot, and hook.

The liquid line routing assembly may include a cover configured to extend over a top region of the liquid line routing assembly and to protect input coolant lines and output coolant lines routed through the liquid line routing assembly.

The cooling fluid manifold may be configured to receive cooling fluid from an external liquid cooling system and to distribute the cooling fluid to all of the cold plates in the enclosure via input coolant lines routed through the liquid line routing assembly.

The IT enclosure may be configured to hold at least two levels of IT components. The liquid line routing assembly is mounted on a lower level of the enclosure with one or more other IT components mounted on top of the liquid line routing assembly. The IT components may include one or more of a storage module, a Central Processing Unit (CPU) module, Graphics Processing Unit (GPU) module, a compute module, a switch module, and a power module.

In another example embodiment, an information handling system includes a chassis configured for mounting a plurality of information technology components, heat exchangers coupled to selected ones of the IT components, a liquid cooling manifold disposed within the chassis, wherein each of the heat exchangers are coupled to the liquid cooling manifold via an input liquid line and an output liquid line, and a liquid line routing apparatus disposed within the chassis. The liquid line routing apparatus comprises at least one sidewall and has one or more openings in the at least one sidewall. The openings are configured to provide a path to route input liquid lines and output liquid lines to selected ones of the heat exchangers. A gate structure is positioned over at least one of the openings. The gate structure is configured to pivot away from the at least one opening to provide access to the opening.

The heat exchangers may be cold plates. The liquid cooling manifold may have a plurality of input connectors coupled to the input liquid lines and a plurality of output connectors coupled to the output liquid lines. The liquid line routing apparatus may include a sidewall having a plurality of openings. The openings are configured to allow the input connectors and the output connectors to extend therethrough. A flange on the liquid line routing apparatus is configured to extend over the liquid cooling manifold.

The liquid line routing apparatus may include at least one structure attached to a top edge of the sidewall. The structure is configured for alignment or attachment of IT components mounted above the liquid line routing assembly. The at least one structure is attached to a top edge of the sidewall comprises one or more of a pin, post, slot, and hook.

BRIEF DESCRIPTION OF THE DRAWINGS

The present invention(s) is/are illustrated by way of example and is/are not limited by the accompanying figures. Elements in the figures are illustrated for simplicity and clarity and have not necessarily been drawn to scale.

DETAILED DESCRIPTION

Figure 1:
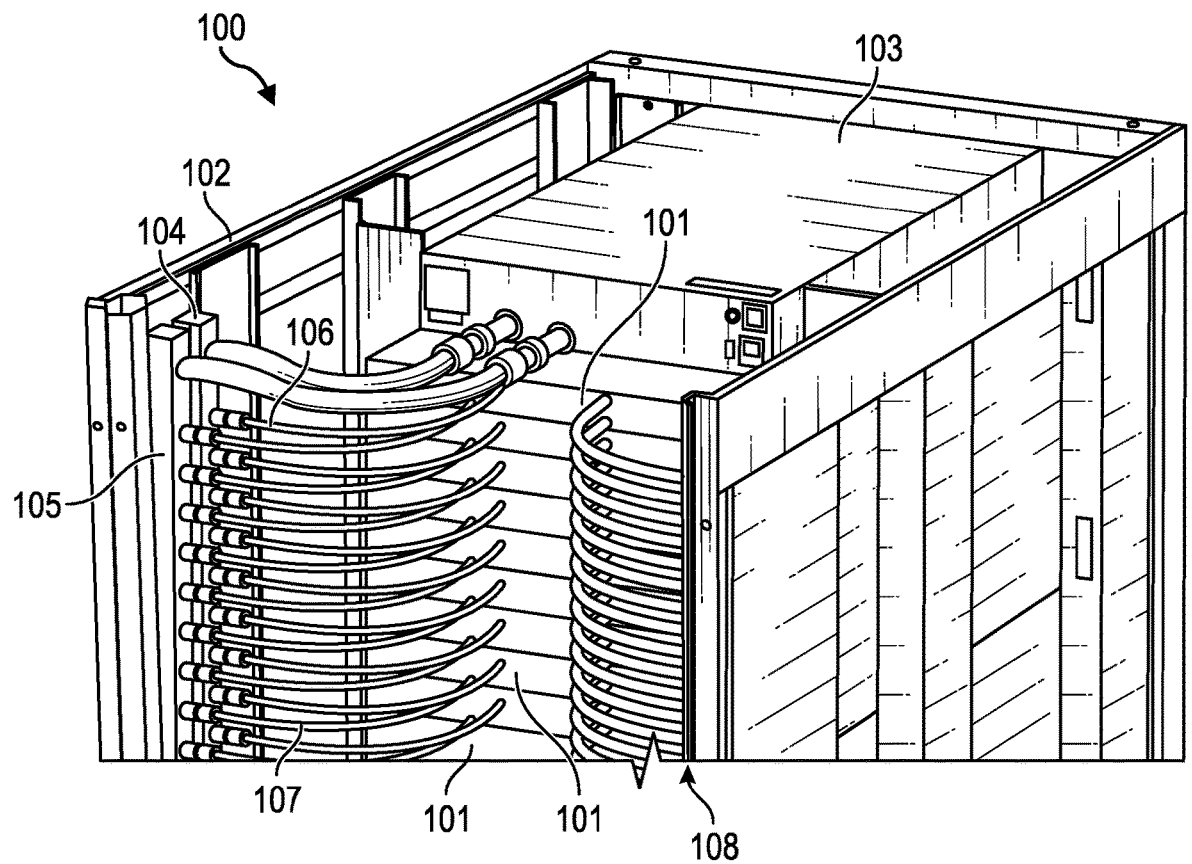
FIG. 1 is a partial, perspective view illustrating an example computing rack that may be used to mount one or more information technology enclosures according to an example embodiment.

The illustrative embodiments provide various aspects of a modular chassis design and for use with a rack assembly. The chassis has height, depth, and width dimensions that enable insertion of a plurality of different sizes of IT gear in IT enclosures.

In the following detailed description of exemplary embodiments, it is to be understood that the specific details presented need not be utilized to practice embodiments of the present disclosure. It is also to be understood that other embodiments may be utilized, and that logical, architectural, programmatic, mechanical, electrical, and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments," or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

It is understood that the use of specific component, device, and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures and described herein may vary. For example, the illustrative components within the example chassis are not intended to be exhaustive, but rather are representative to highlight components that can be utilized to implement various aspects of the present disclosure. For example, other devices, components, or modules may be used in addition to or in place of the hardware and software modules depicted. The depicted examples do not convey or imply any architectural or other limitations with respect to the presently described embodiments and/or the general disclosure.

FIG. 1 is a partial, perspective view illustrating an example computing rack 100 that may be used to mount one or more IT enclosures 101, such as information technology chassis, according to an example embodiment. The IT enclosures 101 may support information handling systems, such as servers. Rack-based information handling systems enable larger scale systems to be deployed in a single structure, such as a rack 100. These racks can hold a plurality of individual servers or server nodes (generally, "information technology (IT) gear"), which can be fully functional units. These individual units may function as self-managed systems and are thus each equipped with individual cooling and power controls and localized system management, independent of other systems within the rack. These IT gear are also designed to fit within the specific rack configuration and are typically of a standard width and depth dimension to fit within the rack structure. Also, depending on the particular rack, the IT gear are design with a standard uniform height that is determined solely by the pre-determined singular height of IT gear the specific rack is design to have inserted therein.

Computing rack 100 includes a frame structure 102, such as side panels with rails or brackets, for mounting multiple IT enclosures 101. The frame structure 102 may also be used to mount a liquid recirculation system 103 that pumps chilled liquid through a liquid cooled segment (not shown) in each IT enclosures 101. Liquid recirculation system 103 cools heated liquid that is returned from the IT enclosures 101.

The IT enclosures 101 may be dimensioned to fit in any suitable type and size of computing rack 100. Examples of suitable computing racks 100 that IT enclosures 101 may be dimensioned for include racks that are generally referred to as 19-inch (482.6 mm) racks or 23-inch (584.2 mm) racks. The 19-inch racks may be constructed according to various specifications, such as the Electronics Industries Alliance 310-D (EIA 310D) specification. Although 23-inch racks are often used by the telecommunication industry, 19-inch racks may be relatively more common with other computing system implementations. In general, these computing racks typically comprise a structure in which one or more IT enclosures 101 and other equipment modules may be mounted.

Computing rack 100 includes an inlet coolant manifold 104 for distributing cooled liquid from liquid recirculation system 103 to IT enclosures 101 and an outlet coolant manifold 105 for receiving heated liquid from IT enclosures 101. Inlet manifold fluidly couples an outlet of liquid recirculation system 103 to the inlet tube 106 for each IT enclosure 101. Outlet manifold 105, on the other hand, fluidly couples an inlet of liquid recirculation system 103 to the outlet tube 107 of each IT enclosure 101. Thus, inlet manifold 104 and outlet manifold 105 enable the cooling of multiple IT enclosures 101 to be provided by a single cooling source (e.g., liquid recirculation system 103). While all IT enclosures 101 configured in computing rack 100 are shown to be provided by a single liquid recirculation system 103, it should be appreciated that, in other embodiments, each IT enclosures 101 may be individually provided by a corresponding number of multiple cooling sources.

Computing rack 100 may have additional components (not shown), such as power modules and management module to provide rack-level power and management. Cabling 108 may provide connections to each IT enclosure 101 for power, Ethernet, or other networking, management, or control connections.

Figure 2A:
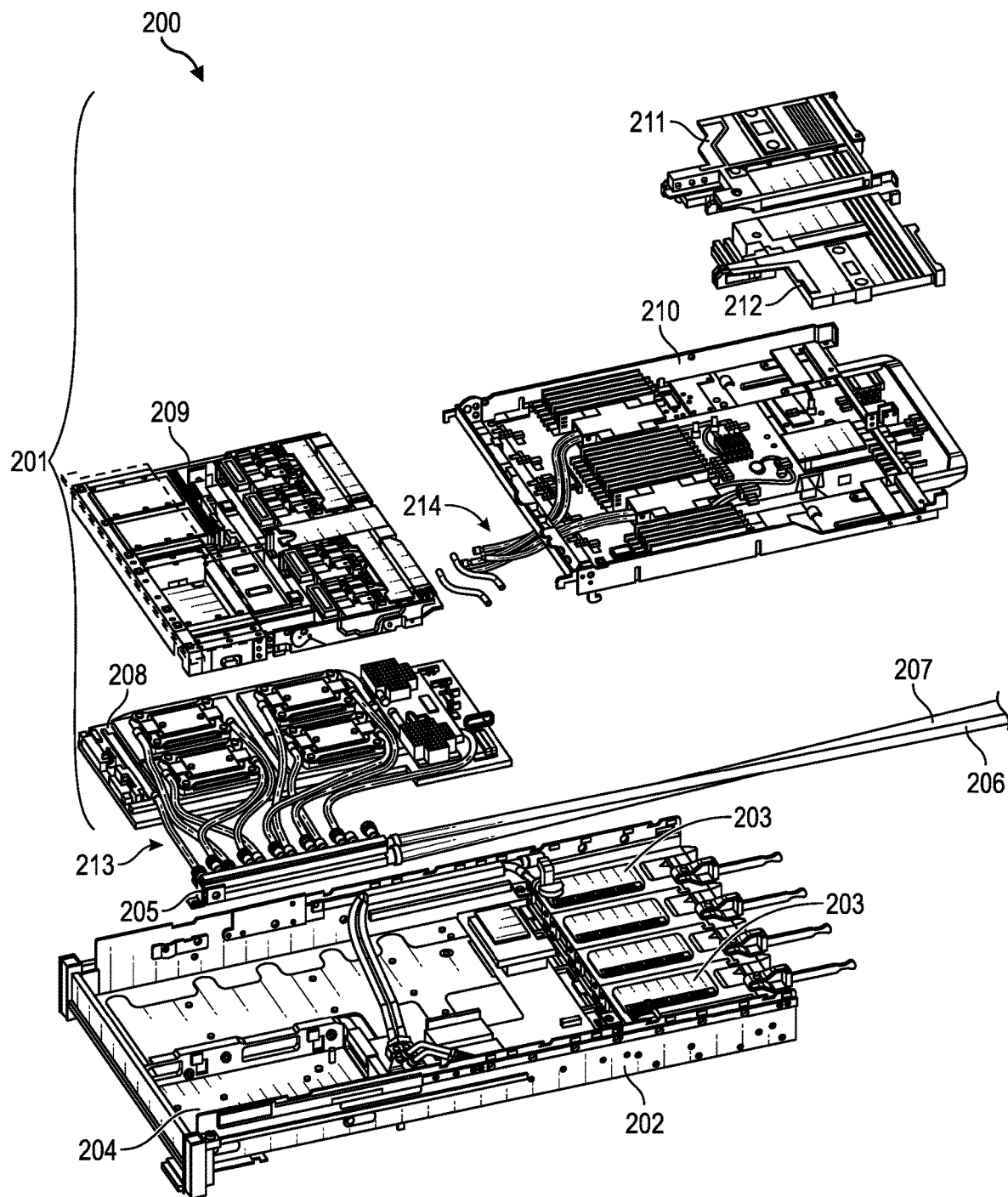
FIG. 2A is an exploded view showing components of an example IT enclosure.
Figure 2B:
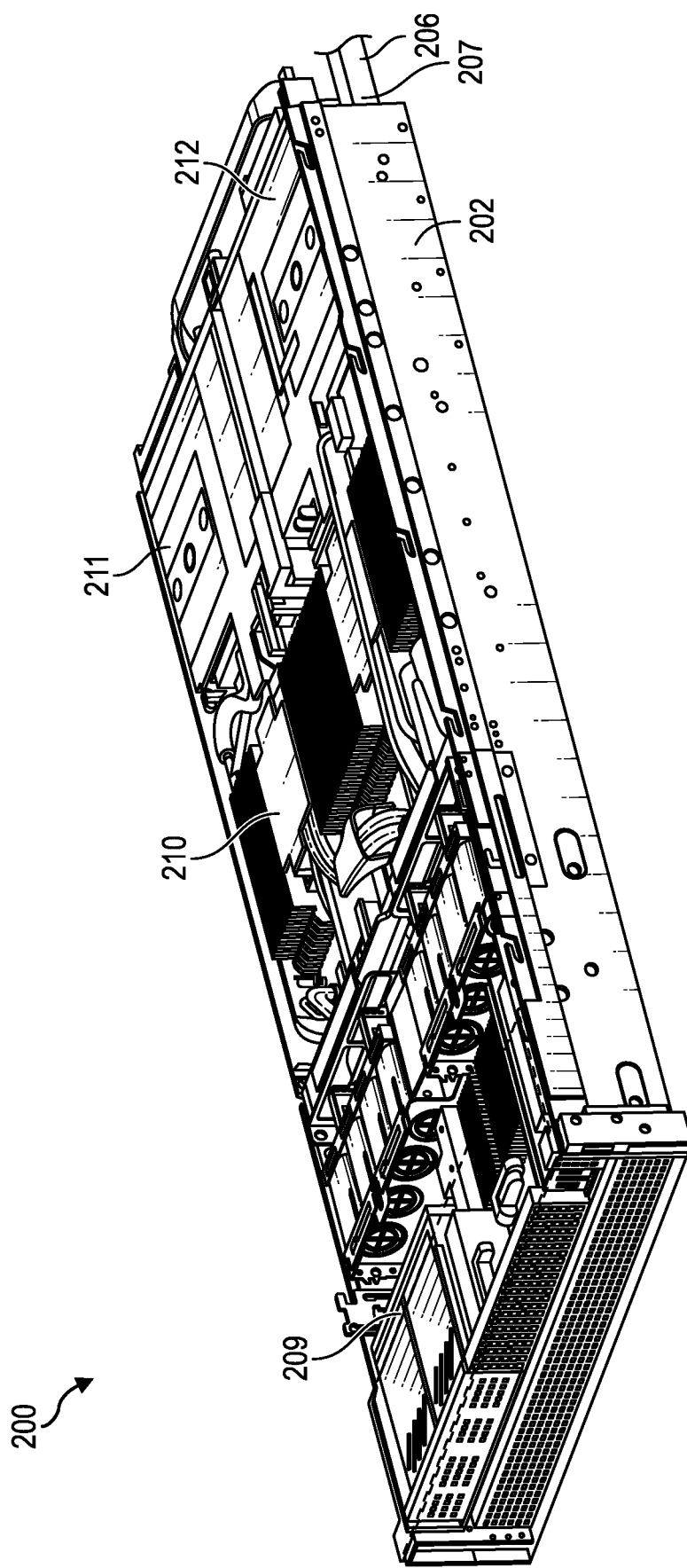
FIG. 2B illustrates the components shown in FIG. 2A combined into the IT enclosure.

FIGS. 2A and 2B illustrate an example IT enclosure 200 having a number of components 201, which are shown as an exploded view in FIG. 2A and as a deployed configuration in FIG. 2B. IT enclosure 200 may be used for an IHS. For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a handheld device, personal computer, a server, a network storage device, or any other suitable device and may vary in size, shape, performance, functionality, and price. The information handling system may include one or more processing resources (such as a Central Processing Unit (CPU), Graphics Processing Unit (GPU), or hardware or software control logic), Random Access Memory (RAM), Read Only Memory (ROM), and/or other types of nonvolatile or volatile memory. Additional components of the information handling system may include one or more disk drives, one or more network ports for communicating with external devices as well as various input and output (I/O) devices, such as a keyboard, a mouse, and a video display. The IHS may also include one or more buses operable to transmit communications between the various hardware components.

IT enclosure 200 includes a chassis 202 configured to hold infrastructure components 201. Chassis 202 has a width and length that are sized as appropriate for mounting in a rack assembly, such as rack 100 (FIG. 1). Chassis 202 in the illustrated example has a height of two rack units. As utilized herein, a rack unit (U or RU) is a unit of measure that describes the height of equipment designed to mount in a 19-inch rack or a 23-inch rack. The width of the equipment that can be mounted inside the rack is less that the width of the mounting frame, but different widths may be supported. One rack unit is 1.75 inches (44.45 mm) high. A 19-inch rack is a standardized frame or enclosure for mounting multiple equipment modules. Each IT enclosure 200 has a front panel that is substantially 19 inches wide, including edges or ears that protrude on each side to allow the module to be fastened to the rack frame with screws.

Components 201 are arranged on two levels in chassis 202, where each level is one rack unit high. A lower level includes power supply units 203, a cooling liquid line routing apparatus 204, a cooling liquid manifold 205, input cooling liquid line 206, output liquid line 207, and a GPU module 208 shown with four GPUs. An upper level includes a storage module 209, a CPU module 210, and first and second Peripheral Component Interconnect Express (PCIe) riser cards 211, 212 for connecting data signals to components 201.

The Thermal Design Power (TDP) for an IT component is the maximum amount of power/heat that a cooling system needs to dissipate for that component. TDPs for IT components have increased with each generation. This has resulted in the implementation of direct liquid cooling instead of relying only on air cooling for IT components. Liquid cooling systems transfer heat up to four times faster than an equal mass of air, which allows for higher performance cooling to be provided with a smaller system. A liquid cooled cold plate can replace the space consumed by heat sinks and fans. Pumps, heat exchangers, tubing, and plates that are required for liquid cold plates can be placed outside the airflow. Liquid cold plates may be used to cool components, such as CPUs and GPUs, with a high power consumption and a high TDP. As components within an IT enclosure reach the limits of air cooling, more liquid cold plates are required inside the chassis. Each of these cold plates require coolant lines 213, 214 to deliver cold liquid to the cold plate and to remove heated liquid from the cold plate.

In existing IT enclosures, discrete cold plate loops are used for each component with a high TDP. The loops in the existing IT enclosures are coupled directly to a rack-level cooling manifold 104, 104 (FIG. 1). These discrete cooling loops are problematic as more components require cold plates and, therefore, the number of connections to the rack-level manifold increase. This requires access to many loops in the rack and requires space inside the chassis to run loops to the rack-level manifold. IT enclosure 200 removes all of the discrete cooling loops by incorporating an in-chassis fluid distribution network to address many of the issues found in existing IT enclosures.

The coolant distribution network in IT enclosure 200 supplies cooling fluid to multiple internal components, such as the processors on GPU module 208 and CPU module 210. The coolant distribution network is comprised of multiple branches of coolant loops 213, 214 aggregated into a common manifold 205. Each coolant branch serves a family of thermally similar components. The common manifold 205 is fed by a single rack-level input cooling liquid line 206 and a single output liquid line 207, which exit IT enclosure and are connected to rack-level manifolds 104, 105. Each branch of the coolant loop is connected to manifold 205 via its own dripless quick disconnect for ease of assembly, failure isolation, and servicing. Each branch can be tuned to the liquid coolant flow requirements of a given component to make the most efficient use of the gross flow to IT enclosure manifold 205 from the rack-level manifold 104.

Figure 3:
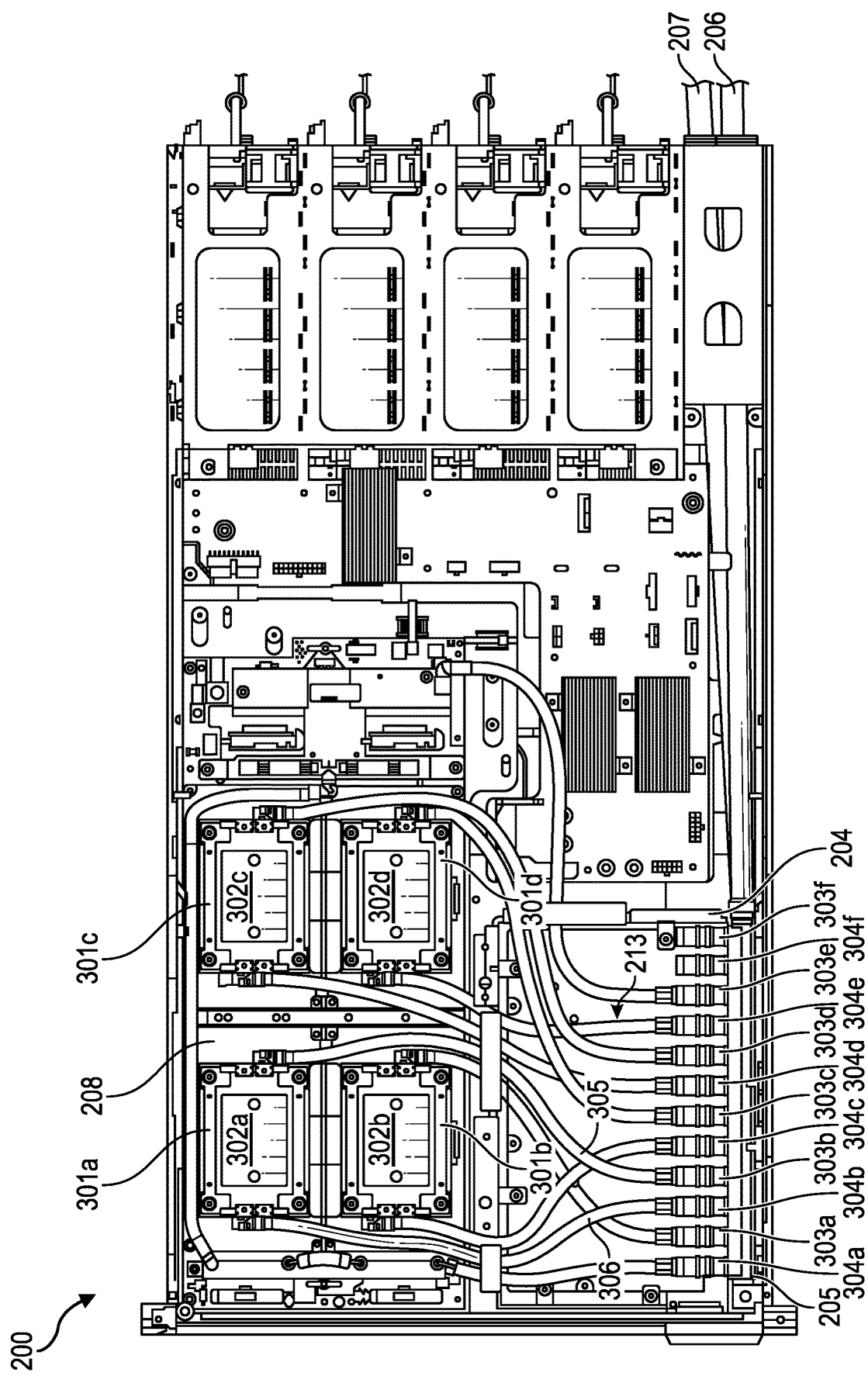
FIG. 3 is a top view illustrating components mounted in the bottom level of IT enclosure including a cooling liquid manifold.

FIG. 3 is a top view illustrating components mounted in the bottom level of IT enclosure 200. GPU module 208 has four GPUs 301*a-d* and each has a corresponding cold plate 302*a-d*. Cold plates 302*a-d* function as heat exchangers and may comprise any system, device, or apparatus that is configured to thermally couple to IT component to transfer heat energy from the component to a cooling fluid within the cold plate. In other embodiments, cold plates 302*a-d* may instead comprise bare-die or direct-contact fluid immersion heat exchangers. Thus, in operation, heat present in an IT component, such as GPUs 301*a-d*, may be thermally conducted through cold plates 302*a-d* and thermally transferred to a fluid present in coolant lines 213. Cold plates 302*a-d* may be constructed from extruded aluminum, machined aluminum, case aluminum, and/or another suitable material that is generally thermally conductive. The coolants used for liquid cooling application may include, for example, water, deionized water, ethylene glycol and water solutions, propylene glycol and water solutions, or polyalphaolefin liquid.

The position, length, height, width, and other physical characteristics of cold plates 302*a-d* and coolant lines 213 may be selected based on desired cooling characteristics, desired fluid flow rates, desired fluid type, component types, component locations, expected component heat generation, and/or any other suitable characteristics of a corresponding IT enclosure 200.

IT enclosure manifold 205 has six input connections 303*a-f* and six output connections 304*a-f*. Connections 303*a-f* and 304*a-f* may be quick disconnect fittings that that allow each coolant line 213 to be easily attached or disengaged, which simplifies servicing of the IT enclosure 200, components 201, and/or the cooling system. Liquid coolant is received at IT enclosure 200 via input cooling liquid line 206, which provides the liquid to manifold 205 for distribution to coolant lines via connections 303*a-f*. The cooling fluid flows through a first coolant lines to an associated cold plate where heat is transferred from an attached IT components to the cooling fluid. The warmed fluid is then passed back to manifold 205 via second coolant line where it is received via an associated connection 304*a-f* and passed out of the IT enclosure via output liquid line 207. For example, GPU processor 301*a* is cooled by fluid passing through connection 303*b* and line 305 to cold plate 302*a*. After the fluid is warmed by thermal transfer from GPU 301*a*, the warmed fluid is passed through line 306 and connection 304*b*. A line routing apparatus 204 may be used to manage the position and routing of coolant lines 213.

In the illustrated embodiment, input connections 303*a-d* are configured to provide cooling fluid to cold plates 302*a-d*, and output connections 304*b-e* are configured to receive warmed fluid from cold plates 302*a-d*. Input connection 303*e* and output connection 304*a* may be used to provide cooling liquid to other components of IT enclosure 200, such as CPU module 210 via lines 214. Further, an additional pair of connections (input connection 303*f* and output connection 304*f*) are not used but allow for future expansion in IT enclosure 200 to add other components that require liquid cooling. Although the example manifold 205 illustrated in FIG. 3 has six input connections 303*a-f* and six output connections 304*a-f*, it will be understood that any number of input connections and output connections may be provided in other embodiments.

Figure 4:
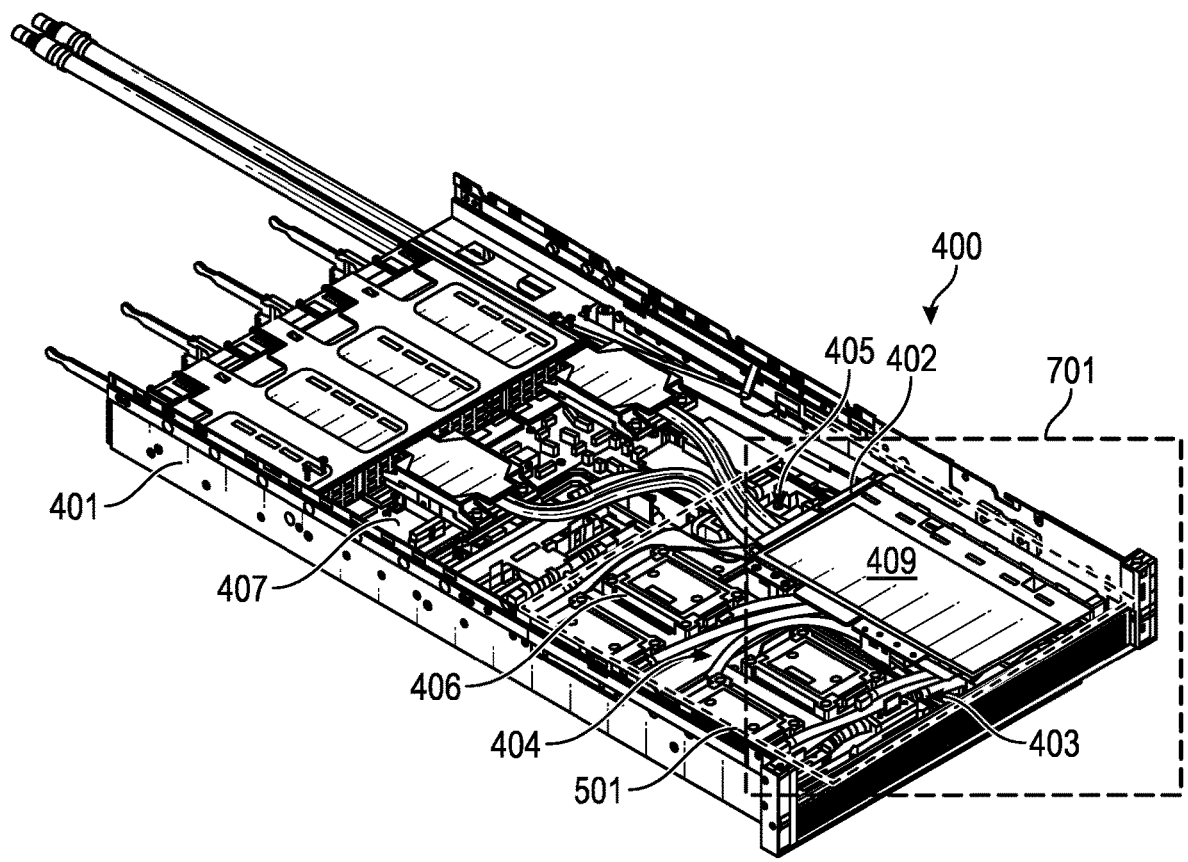
FIG. 4 is perspective view of another example embodiment of an IT enclosure illustrating an alternative arrangement of components within a chassis.

FIG. 4 is perspective view of another example embodiment of an IT enclosure 400 illustrating an alternative arrangement of components within a chassis 401. A liquid line routing assembly 402, similar to apparatus 204 (FIG. 2A), is one rack unit tall and is positioned on a lower level of chassis 401. Liquid line routing assembly 402 includes several openings for routing coolant lines 403-405 to IT components, such cold plates on a GPU module 406 or cold plates on a CPU module 407.

Direct liquid cooling (DLC) presents difficulty in routing coolant lines 403-405 in tight spaces within the IT enclosure 400. Adding an apparatus such as liquid line routing assembly 402 helps to route the coolant lines routing in the small areas and tight spaces that are present in many IT enclosures. Liquid line routing assembly 402 aides in routing the coolant lines and provides structural support for other components in IT enclosure 400. For example, the liquid line routing assembly 402 also provides structural support for a cooling liquid manifold, such as manifold 205, and provides installation alignment and support for upper level components in chassis 401, such as a storage tray 209 that may reside above liquid line routing assembly 402. A cover 409 may be attached to the top of liquid line routing assembly 402 to protect the cooling liquid manifold and connections to coolant lines.

Figure 5:
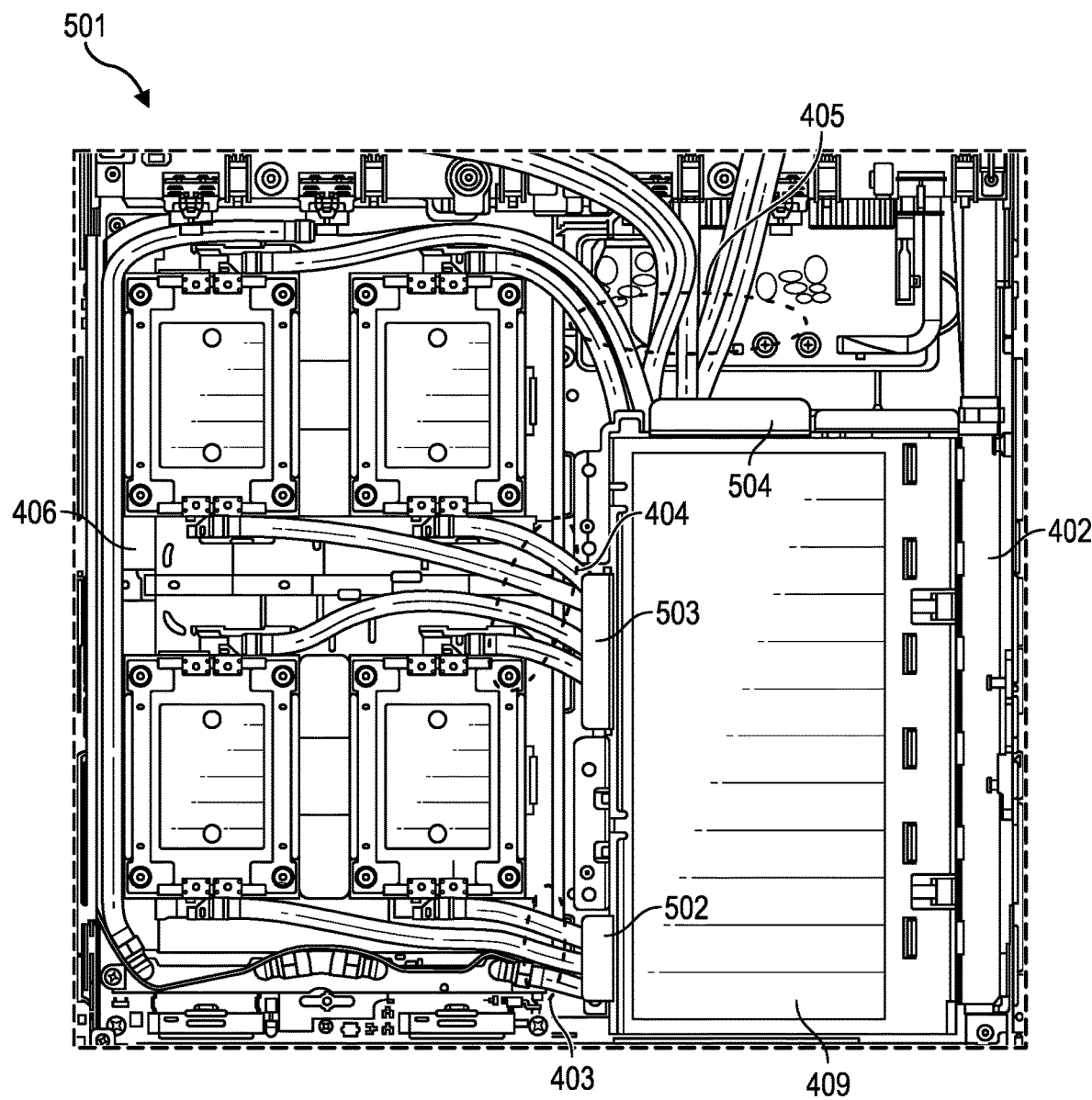
FIG. 5 is a detailed top view showing one area of the IT enclosure illustrated in FIG. 4.

FIG. 5 is a detailed top view showing area 501 of IT enclosure 400 illustrated in FIG. 4, including liquid line routing assembly 402 and cover 409 along with coolant lines 403-405 that are connected to cold plates on GPU module 406 and other components. The liquid line routing assembly 402 has several openings that are configured to route coolant lines 403-405 out of liquid line routing assembly 402 from the cooling liquid manifold to the IT component cold plates. Gates 502-504 can be pivoted upward to access the openings in liquid line routing assembly 402 and to route the coolant lines 403-405. Gates 502-504 can also be opened during maintenance, for example, to replace coolant lines and/or to add new coolant loops when new IT components with cold plates are added to IT enclosure 400. In other embodiments, gates 502-504 may be removable instead of, or in addition to, being pivotable to access the openings in liquid line routing assembly 402 and to route the coolant lines 403-405.

In one embodiment, the top surface of cover 409 may include a label, which may include information regarding the IT components, such as GPU module 406, and/or information about servicing the liquid cooling system.

Figure 6:
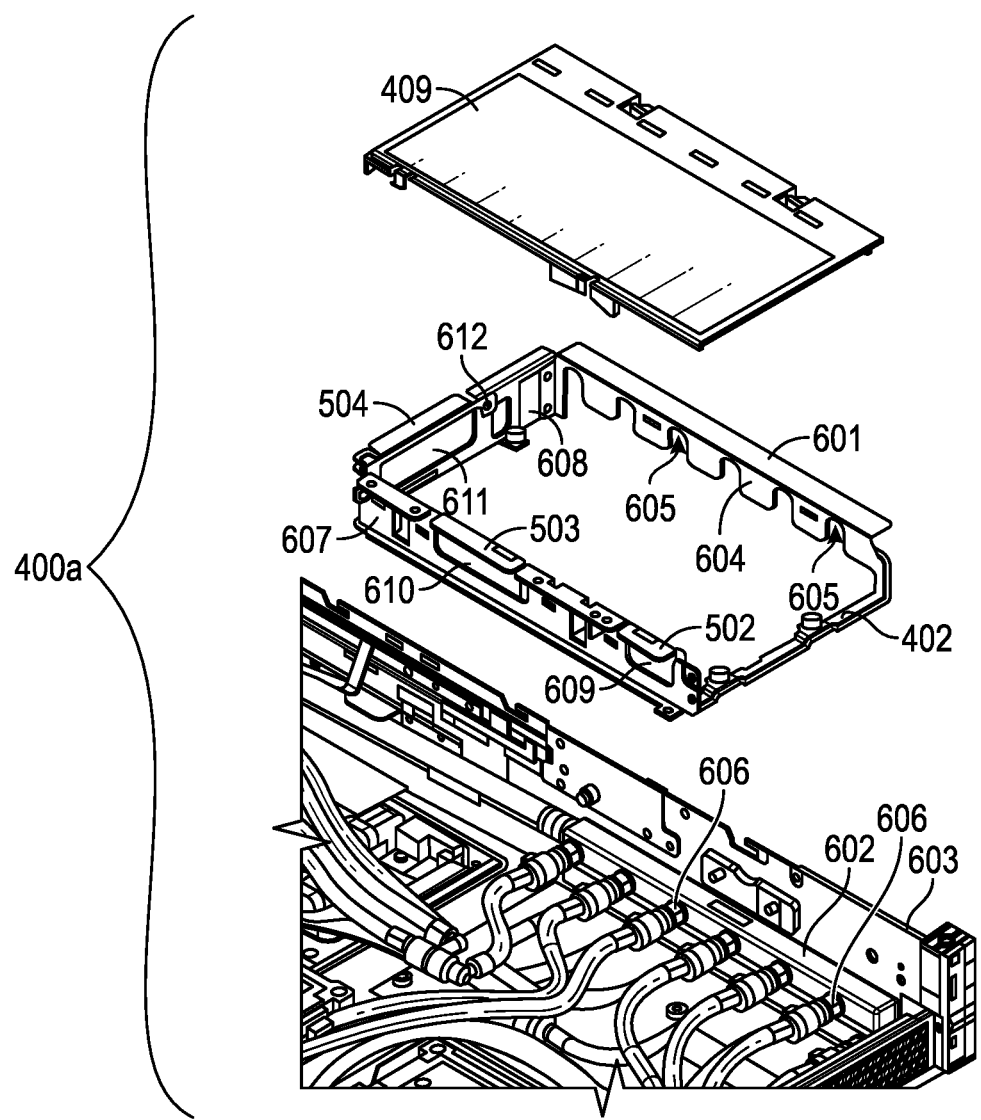
FIG. 6 is a partial perspective view of the IT enclosure shown in FIG. 4 with an exploded view of a liquid line routing assembly and cover plate.

FIG. 6 is a partial perspective view 400*a* of IT enclosure 400 showing an exploded view of liquid line routing assembly 402 and cover 409. The liquid line routing assembly 402 has a flange 601 that covers and protects a cooling liquid manifold 602 when installed against a sidewall 603 of chassis 401. An outer wall 604 of liquid line routing assembly 402 has a plurality of openings 605 that are adapted to fit over quick disconnect fittings 606 on cooling liquid manifold 602. Openings 605 are shown with an arched shape that allows liquid line routing assembly 402 to be placed over an existing cooling liquid manifold 602. In other embodiments, openings 605 may be generally circular shaped and configured to receive quick disconnect fittings 606 through the openings.

Gates 502-504 are located on inner walls 607, 608 of liquid line routing assembly 402 and are positioned over openings 609-611, respectively. Gates 502-504 are configured to pivot upward on a hinge pin 612 to expose openings 609-611, which simplifies the installation and routing of coolant lines between quick disconnect fittings 606 and cold plates on IT components in the chassis 401.

Figure 7:
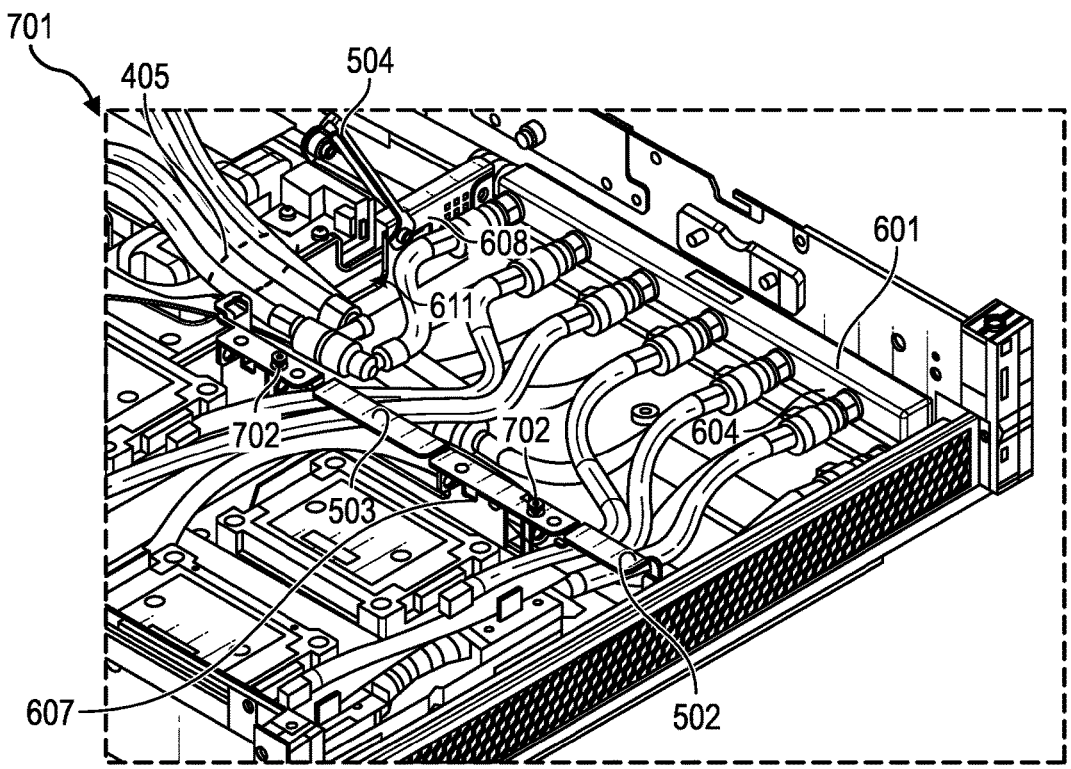
FIG. 7 is a detailed perspective view of one area of the IT enclosure illustrated in FIG. 4 showing the liquid line routing assembly with one coolant line gate open.

FIG. 7 is a detailed perspective view showing area 701 of IT enclosure 400 illustrated in FIG. 4 in a configuration having gate 504 open, which would allow for servicing of the coolant lines 405. The ability to open gates 502-504 simplifies maintenance and service of IT enclosure 400 and the liquid coolant system as well as keeping the coolant lines organized and routed as desired. Furthermore, new coolant loops can easily be installed if new IT components are added to the IT enclosure with cold plates.

FIG. 7 further illustrates a flat surface on the top of sidewalls 604, 607, 608 on the liquid line routing assembly 402, including the top of gates 502-504. These flat surfaces provide structural support for IT components that are installed above the liquid line routing assembly 402, such as a storage module 209 (FIG. 2). Pins 702 on the top of inner sidewall 607 may be used to align the IT component installed above the liquid line routing assembly 402 and to hold that device in place. In other embodiments, pins 702 may be replaced with posts, slots, hooks, or other devices for engaging with IT components installed above the liquid line routing assembly 402.

Figure 8:
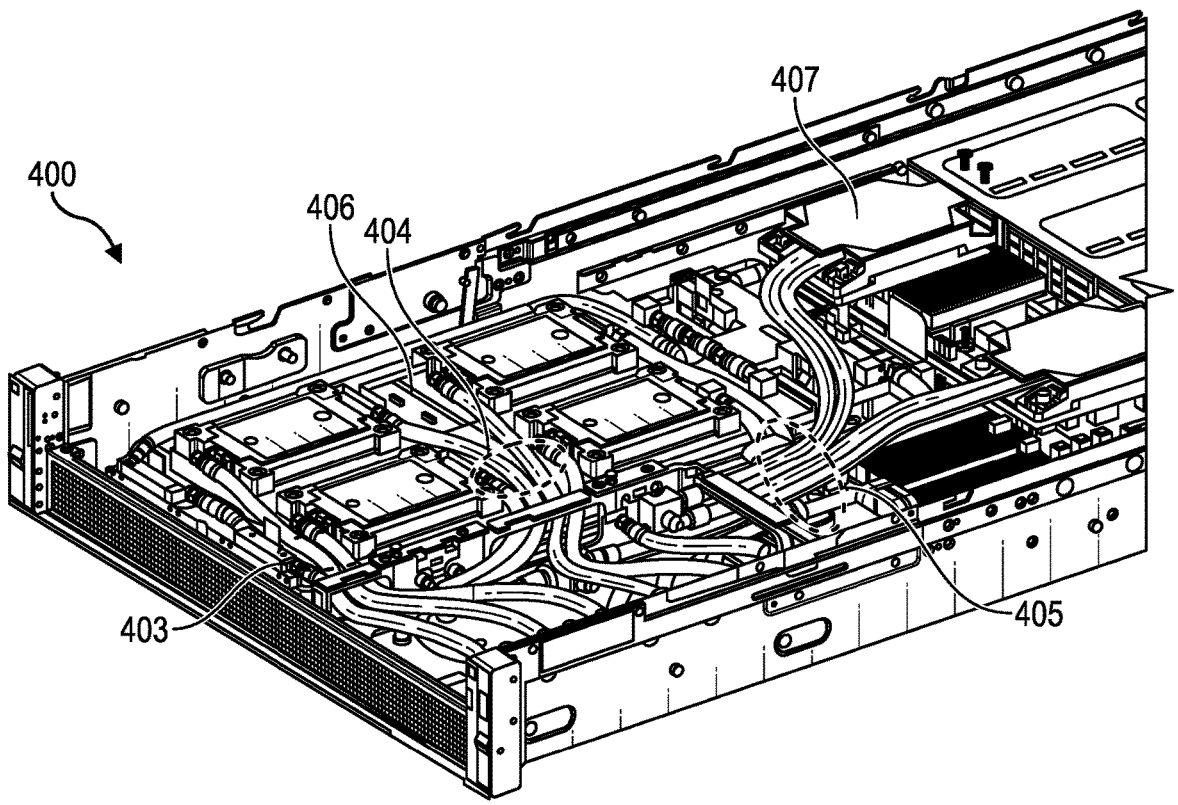
FIG. 8 is another perspective view of the components installed on a lower layer of an IT enclosure including a liquid line routing assembly and liquid coolant lines coupled to cold plates on IT components.

FIG. 8 is another perspective view of the components installed on a lower layer of IT enclosure 400 including the liquid line routing assembly 402. Coolant lines 403-405 are routed through openings in liquid line routing assembly 402 to cold plates on GPU module 406 and CPU module 407. Although GPU and CPU modules are shown in the illustrated embodiments, it will be understood that the liquid coolant system may be used with any IT component that requires a thermal solution that cannot be met with air cooling, such as a power board, switch board, compute component or the like.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. An Information Technology (IT) equipment enclosure, comprising:
    a chassis including at least one chassis sidewall;
    a plurality of IT components disposed across at least a lower level and a higher level of the chassis;
    cold plates coupled to the plurality of IT components;
    a cooling fluid manifold installed against the at least one chassis sidewall and coupled to each of the cold plates via a corresponding input coolant line and a corresponding output coolant line; and
    a liquid line routing assembly disposed within the IT equipment enclosure adjacent the cooling fluid manifold, wherein the liquid line routing assembly comprises:
        a first sidewall having individual openings, each individual opening configured to accommodate one of the input or output coolant lines extending to or from the cooling fluid manifold;
        a second sidewall having at least one opening configured to route two or more of the input or output coolant lines; and
        at least one pin, post, slot, or hook attached to a top edge of at least one of the first or second sidewalls,
    wherein the liquid line routing assembly and a first IT component of the plurality of IT components are mounted on the lower level of the chassis, and at least one second IT component of the plurality of IT components is mounted on the higher level of the chassis, and
    wherein the at least one pin, post, slot, or hook is configured for mounting the at least one second IT component.

2. The IT equipment enclosure of claim 1, wherein the second sidewall is parallel to the first sidewall.

3. The IT equipment enclosure of claim 1, wherein the second sidewall is perpendicular to the first sidewall.

4. The IT equipment enclosure of claim 1, wherein the liquid line routing assembly comprises a third sidewall having at least one other opening configured to route two or more other ones of the input or output coolant lines.

5. The IT equipment enclosure of claim 1, wherein each of the individual openings is configured to allow a single coolant line connector to extend therethrough.

6. The IT equipment enclosure of claim 1, wherein the first sidewall comprises:
    a flange configured to extend over the cooling fluid manifold.

7. The IT equipment enclosure of claim 1, wherein the input coolant line is one of a plurality of input coolant lines, and wherein the cooling fluid manifold is configured to receive cooling fluid from an external liquid cooling system and to distribute the cooling fluid to all of the cold plates in the enclosure via the input coolant lines routed through the liquid line routing assembly.

8. The IT equipment enclosure of claim 1, wherein the at least one second IT component comprise one or more of a storage module, a Central Processing Unit (CPU) module, Graphics Processing Unit (GPU) module, a compute module, a switch module, and a power module.

9. The IT equipment enclosure of claim 1, wherein the second sidewall comprises a gate positioned over one of the at least one opening, the gate configured to pivot, via a hinge pin, away from the one opening to provide access to the one opening.

10. The IT equipment enclosure of claim 9, wherein the gate is removable from the one opening to provide access to the one opening.

11. The IT equipment enclosure of claim 9, wherein the one opening faces the gate when the gate is in a non-pivoted position.

12. An Information Handling System (IHS), comprising:
a chassis including at least one chassis sidewall and configured for mounting a plurality of Information Technology (IT) components disposed across at least a lower level and a higher level of the chassis;
a liquid cooling manifold installed against the at least one chassis sidewall, wherein the liquid cooling manifold further comprises a plurality of connectors configured to receive input liquid lines and output liquid lines; and
a liquid line routing apparatus disposed within the chassis adjacent the liquid cooling manifold, wherein the liquid line routing apparatus comprises:
a first sidewall having individual openings, each individual opening configured to accommodate one of the input or output liquid lines extending to or from the liquid cooling manifold;
a second sidewall having at least one opening configured to route two or more of the input or output liquid lines; and
at least one pin, post, slot, or hook attached to a top edge of at least one of the first or second sidewalls,
wherein the liquid line routing apparatus and a first IT component of the plurality of IT components are mounted on the lower level of the chassis, and at least one second IT component of the plurality of IT components is mounted on the higher level of the chassis, and
wherein the at least one pin, post, slot, or hook is configured for mounting the at least one second IT component.

13. The IHS of claim 12, wherein the liquid line routing apparatus comprises a third sidewall perpendicular to the second sidewall, the third sidewall having at least one other opening configured to route two or more other ones of the input or output liquid lines.

14. The IHS of claim 12, wherein the second sidewall is parallel to the first sidewall.

15. The IHS of claim 12, wherein the first sidewall comprises a flange configured to extend over the liquid cooling manifold.

16. The IHS of claim 12, wherein each of the individual openings is configured to allow a single one of the connectors to extend therethrough.

17. The IHS of claim 12, wherein the second sidewall comprises a gate positioned over one of the at least one opening, the gate configured to pivot, via a hinge pin, away from the one opening to provide access to the one opening.

18. The IHS of claim 17, wherein the one opening faces the gate when the gate is in a non-pivoted position.

19. An Information Technology (IT) equipment enclosure, comprising:
a chassis including at least one chassis sidewall;
a plurality of IT components disposed across at least a lower level and a higher level of the chassis;
cold plates coupled to the plurality of IT components;
a liquid cooling manifold installed against the at least one chassis sidewall and coupled to each of the cold plates via a corresponding input liquid line and a corresponding output liquid line; and
a liquid line routing assembly disposed within the IT equipment enclosure adjacent the liquid cooling fluid manifold, wherein the liquid line routing assembly comprises:
a first sidewall having individual openings, each individual opening configured to accommodate one of the input or output liquid coolant lines extending to or from the liquid cooling manifold;
a second sidewall having at least one opening configured to route one or more of the input or output liquid lines; and
at least one pin, post, slot, or hook attached to a top edge of at least one of the first or second sidewalls,
wherein the liquid line routing assembly and a first IT component of the plurality of IT components are mounted on the lower level of the chassis, and at least one second IT component of the plurality of IT components is mounted on the higher level of the chassis, and
wherein the at least one pin, post, slot, or hook is configured for mounting the at least one second IT component.

20. The IT equipment enclosure of claim 19, wherein the liquid cooling manifold is positioned between the chassis sidewall and the first sidewall.

* * * * *